US008089036B2

(12) United States Patent
Manabe

(10) Patent No.: US 8,089,036 B2
(45) Date of Patent: Jan. 3, 2012

(54) IMAGE SENSOR WITH GLOBAL SHUTTER AND IN PIXEL STORAGE TRANSISTOR

(75) Inventor: Sohei Manabe, San Jose, CA (US)

(73) Assignee: OmniVision Technologies, Inc., Santa Clara, CA (US)

(*) Notice: Subject to any disclaimer, the term of this patent is extended or adjusted under 35 U.S.C. 154(b) by 393 days.

(21) Appl. No.: 12/433,598

(22) Filed: Apr. 30, 2009

(65) Prior Publication Data

US 2010/0276574 A1 Nov. 4, 2010

(51) Int. Cl.
*H01L 27/00* (2006.01)
*H01J 40/14* (2006.01)
(52) U.S. Cl. .................. 250/208.1; 250/214 R
(58) Field of Classification Search ............ 250/208.1, 250/214.1, 214 R, 214 DC, 206; 348/294, 348/302, 303, 304, 307, 308; 257/225, 231, 257/239, 257, 258, 290, 291, 292, 440, 431
See application file for complete search history.

(56) References Cited

U.S. PATENT DOCUMENTS

| | | | |
|---|---|---|---|
| 5,146,302 A * | 9/1992 | Kumada | 257/225 |
| 5,869,857 A * | 2/1999 | Chen | 257/292 |
| 6,414,342 B1 | 7/2002 | Rhodes | |
| 6,760,070 B1 | 7/2004 | Merrill et al. | |
| 7,045,754 B2 * | 5/2006 | Manabe et al. | 250/208.1 |
| 7,075,049 B2 | 7/2006 | Rhodes et al. | |
| 7,129,979 B1 | 10/2006 | Lee | |
| 7,214,575 B2 | 5/2007 | Rhodes | |
| 7,271,835 B2 * | 9/2007 | Iizuka et al. | 348/314 |
| 2005/0017155 A1 * | 1/2005 | Manabe et al. | 250/214.1 |
| 2005/0110093 A1 | 5/2005 | Altice et al. | |
| 2005/0110885 A1 * | 5/2005 | Altice et al. | 348/308 |
| 2005/0266597 A1 | 12/2005 | Rhodes | |
| 2006/0044437 A1 | 3/2006 | Shah | |
| 2006/0138486 A1 | 6/2006 | Lim | |
| 2007/0152292 A1 | 7/2007 | Toros et al. | |
| 2007/0285545 A1 | 12/2007 | Hsieh | |

FOREIGN PATENT DOCUMENTS

| | | |
|---|---|---|
| EP | 1 117 250 A2 | 7/2001 |
| WO | WO 2006/011933 | 11/2006 |
| WO | WO 2007/024561 A1 | 3/2007 |

OTHER PUBLICATIONS

Rhodes, Howard E., "Globally Reset Image Sensor Pixels", U.S. Appl. No. 12/130,819, filed May 30, 2008.

* cited by examiner

*Primary Examiner* — Que T Le
*Assistant Examiner* — Jennifer Bennett
(74) *Attorney, Agent, or Firm* — Blakely Sokoloff Taylor & Zafman LLP

(57) ABSTRACT

An image sensor includes a photodiode to accumulate an image charge and a storage transistor to store the image charge. A transfer transistor is coupled between the photodiode and an input of the storage transistor to selectively transfer the image charge from the photodiode to the storage transistor. An output transistor is coupled to an output of the storage transistor to selectively transfer the image charge to a readout node and a reset transistor is coupled to the readout node. A controller is configured to apply a negative voltage to a gate of the storage transistor before activating the gate of the storage transistor to store the image charge.

16 Claims, 9 Drawing Sheets

IMAGE SENSOR WITH GLOBAL SHUTTER AND IN PIXEL STORAGE TRANSISTOR

TECHNICAL FIELD

This disclosure relates generally to image sensors, and in particular but not exclusively, relates to image sensors with a global shutter.

BACKGROUND INFORMATION

For high speed image sensors, a global shutter can be used to capture fast-moving objects. A global shutter typically enables all pixels in the image sensor to simultaneously capture the image. For slower moving objects, the more common rolling shutter is used. A rolling shutter normally captures the image in a sequence. For example, each row within a two-dimensional ("2D") pixel array may be enabled sequentially, such that each pixel within a single row captures the image at the same time, but each row is enabled in a rolling sequence. As such, each row of pixels captures the image during a different image acquisition window. For slow-moving objects the time differential between each row generates image distortion. For fast-moving objects, a rolling shutter causes a perceptible elongation distortion along the object's axis of movement.

To implement a global shutter, storage capacitors or storage transistors can be used to temporarily store the image charge acquired by each pixel in the array while it awaits readout from the pixel array. When a global shutter is used, leakage current of the stored charge from a captured image increases because of the longer time periods in which the charge is held. Because the rows are read out sequentially, leakage for some rows can be greater than leakage for other rows. Accordingly, the leakage can cause the image to vary by rows with respect to displaying uniform colors. When using a storage transistor, the image charges are further corrupted by large leakage current from surface states beneath the gate of the storage transistor.

FIG. 1A illustrates a conventional complementary metal-oxide-semiconductor ("CMOS") imaging pixel 100 with a global shutter. Imaging pixel 100 comprises a shutter transistor 110, photodiode 120, transfer transistor 130, storage transistor 140, output transistor 150, reset transistor 160, amplifier transistor 180, and row-select (RS) transistor 190.

FIG. 1B illustrates operation of imaging pixel 100. Shutter transistor 110 is deactivated with a global shutter signal to acquire an image signal or charge within photodiode 120. While the image charge is being acquired, imaging pixel 100 resets floating diffusion (FD) node by activating reset transistor 160 while shutter transistor 110 is disabled. Then, output transistor 150 is toggled on and off while storage transistor 140 remains deactivated. Reset transistor 160 is then disabled and storage transistor 140 enabled to prepare for image transfer from photodiode 120. Image transfer from photodiode 120 to storage transistor 140 is accomplished by activating transfer transistor 130 long enough to transfer all charge from photodiode 120. Transfer transistor 130 is once again deactivated in preparation for the next image acquisition window, while the current image charge is stored in storage transistor 140. The current image is then readout of each imaging pixel 100 in an array of imaging pixels line-by-line by appropriate assertion of row select transistor 190 and output transistor 150.

In imaging pixel 100, both transfer gate transistor 130 and shutter gate transistor 110 are connected to photodiode 120. Shutter gate transistor 110 typically has a device size that is similar to transfer gate transistor 130 in order to fully deplete (photo-voltaically generated) charges in photodiode 120. Additionally, transfer gate transistor 130 is normally wider than storage gate transistor 140 and larger than control gate transistor 150, reset transistor 160, amplifier 180, and row-select transistor 190 in order to fully deplete the photodiode 120. Thus, two large-size devices are normally provided for each conventional imaging pixel. Because two relatively large size devices are used for each imaging pixel, the photodiode area of each pixel is correspondingly smaller. The relatively smaller photodiode area reduces the fill factor of imaging pixel 100, which reduces the amount of pixel area that is sensitive to light and reduces low light performance.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a system and method of operation for an image sensor with global shutter and storage capacitors are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. For example, the term "or" is used in the inclusive sense (e.g., as in "and/or") unless the context clearly indicates otherwise.

Figure 1A:
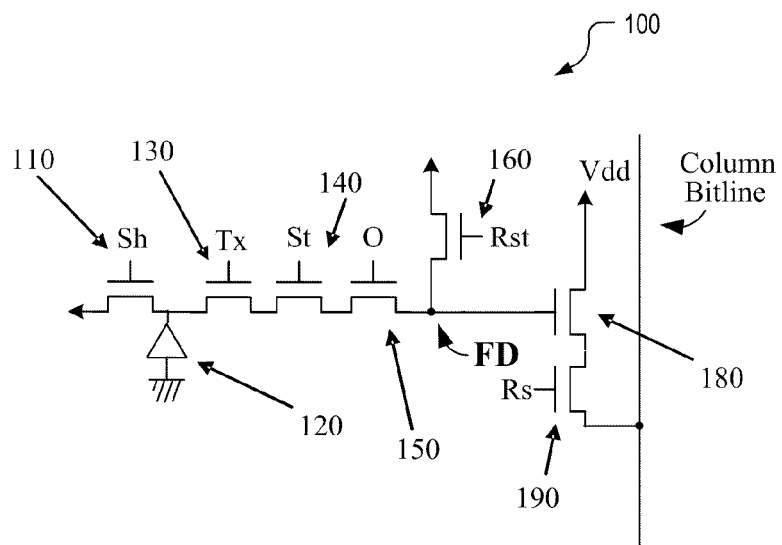
FIG. 1A (prior art) is a circuit diagram of a conventional imaging pixel.
Figure 1B:
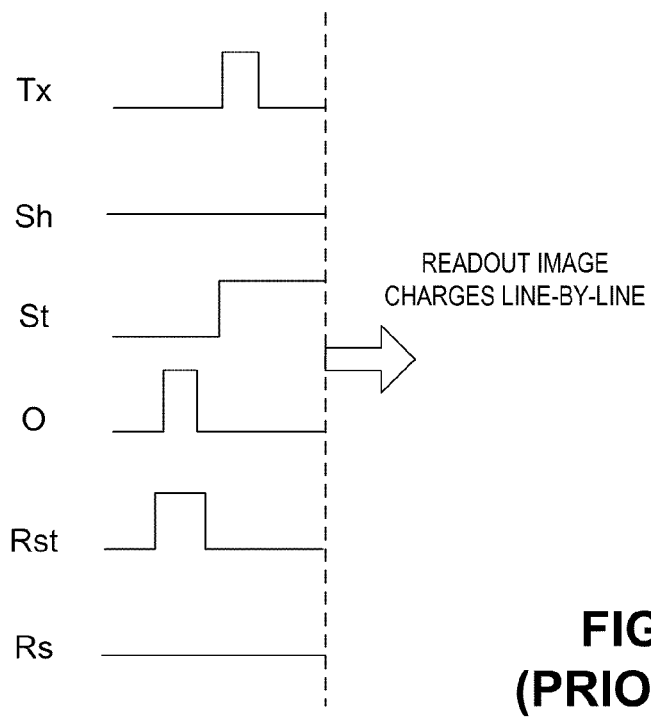
FIG. 1B (prior art) is a timing diagram illustrating readout operation of a conventional imaging pixel.
Figure 2:
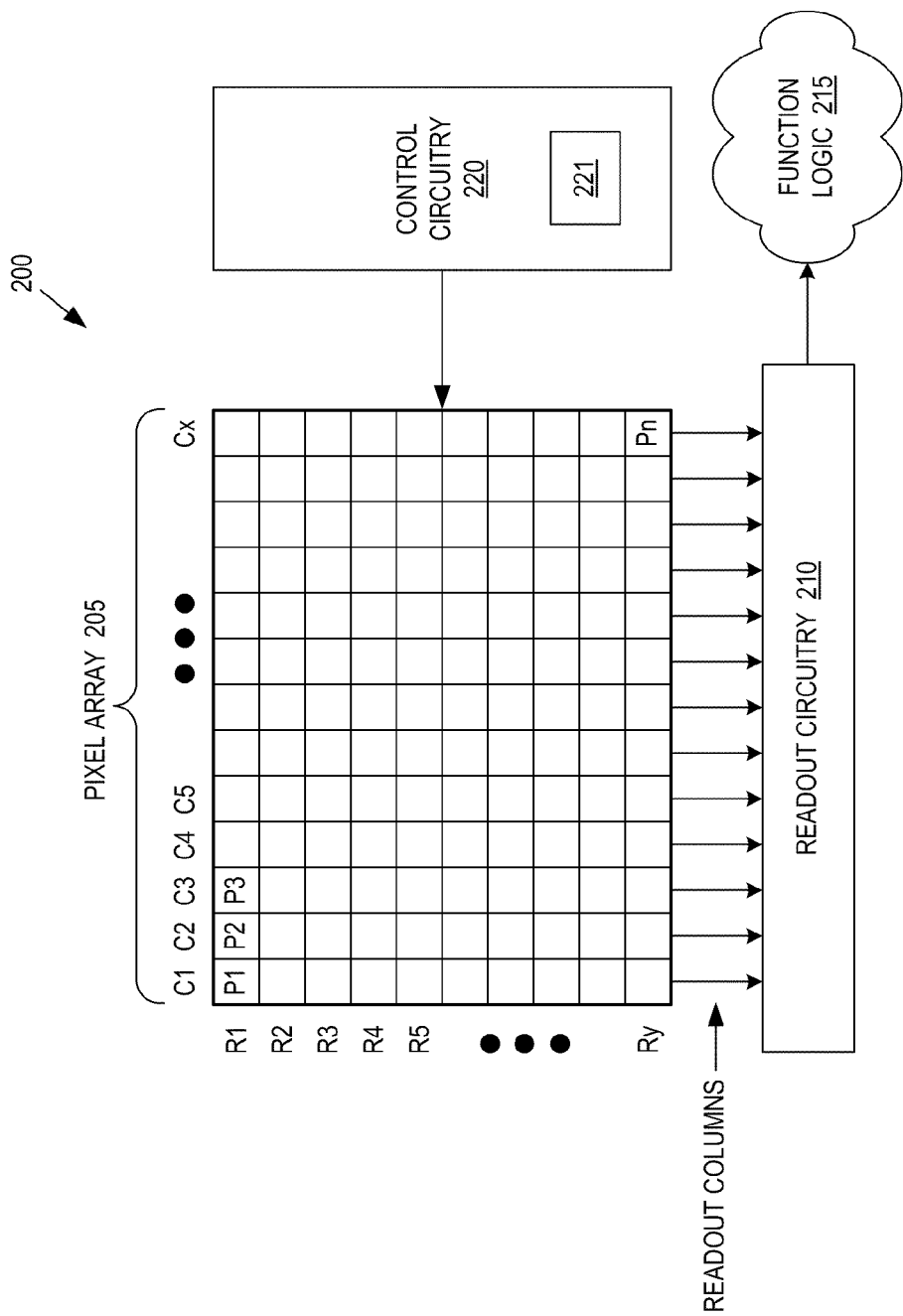
FIG. 2 is a functional block diagram illustrating an imaging system, in accordance with an embodiment of the invention.

FIG. 2 is a block diagram illustrating an imaging system 200, in accordance with an embodiment of the invention. The illustrated embodiment of imaging system 200 includes a pixel array 205, readout circuitry 210, function logic 215, and control circuitry 220.

Pixel array 205 is a two-dimensional ("2D") array of imaging sensors or pixels (e.g., pixels P1, P2 . . . , Pn). In one embodiment, each pixel is an active pixel sensor ("APS"), such as a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by readout circuitry 210 and transferred to function logic 215. Readout circuitry 210 may include amplification circuitry, analog-to-digital conversion circuitry, or otherwise. Function logic 215 may be a processor, logic function circuitry, and/or memory. Function logic 215 may simply store the image data or even manipulate the image data by applying post image effects (e.g., crop, rotate, remove red eye, adjust brightness, adjust contrast, or otherwise). In one embodiment, readout circuitry 210 may readout a row of image data at a time along readout column lines (illustrated) or may readout the image data using a variety of other techniques (not illustrated), such as a serial readout or a full parallel readout of all pixels simultaneously.

Control circuitry 220 can be a controller that is coupled to pixel array 205 to control operational characteristic of pixel array 205. For example, control circuitry 220 may generate a shutter signal for controlling image acquisition. In one embodiment, the shutter signal is a global shutter signal for simultaneously enabling all pixels within pixel array 205 to simultaneously capture their respective image data during a single acquisition window.

When a global shutter is used, leakage current of the stored charge from a captured image causes leakage of charge from the storage transistor in each pixel over time. Because the rows are read out sequentially, leakage for some rows can be greater than leakage for other rows.

Figure 4A:
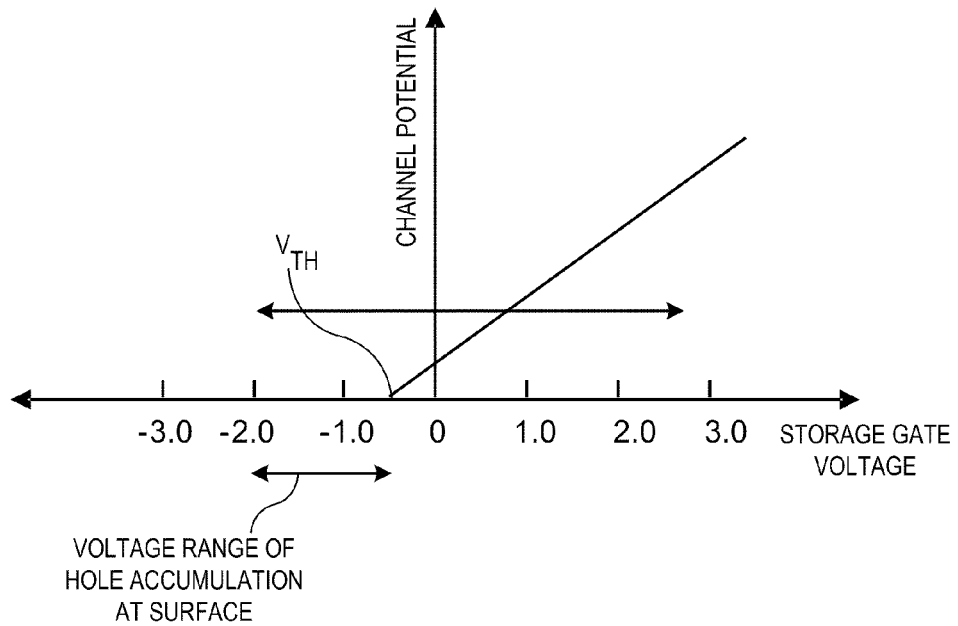
FIG. 4A is a line graph illustrating a negative gate voltage applied to the gate of a storage transistor during operation of an imaging pixel, in accordance with an embodiment of the invention.
Figure 4B:
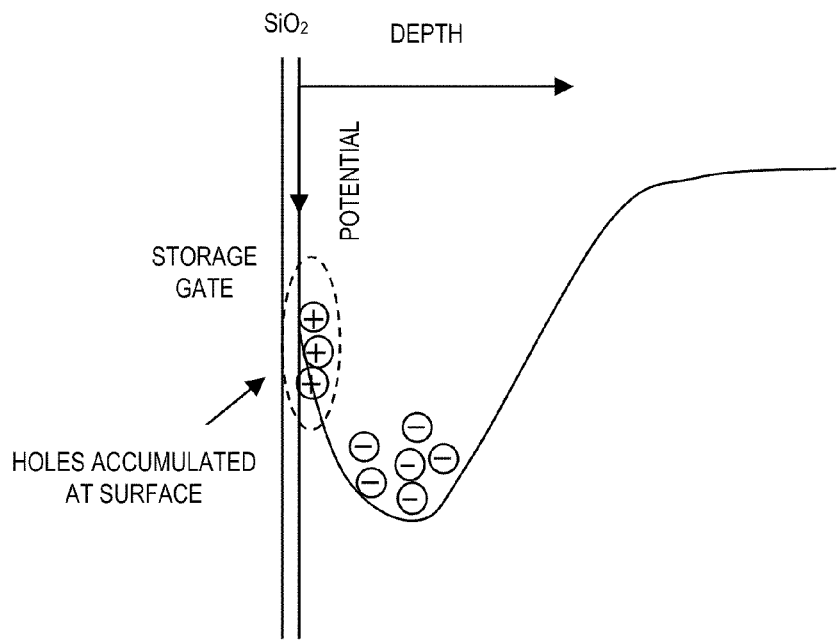
FIG. 4B is a line graph illustrating hole accumulation below the gate of a storage transistor during operation of an imaging pixel, in accordance with an embodiment of the invention.

In one embodiment, control circuitry 220 may generate a negative voltage to be applied to the gate of a storage transistor before the storage transistor is activated. In one embodiment, the storage gate control signal is more than 0.5 V below the threshold voltage $V_{TH}$ of the storage transistor (e.g., see FIG. 4A). By isolating the storage gate and applying a negative voltage to the gate of the storage transistor, "holes" can be accumulated in a portion of the substrate that underlies the gate of the storage transistor (see FIG. 4B). By applying the negative voltage to the storage gate, holes are accumulated at surface states. This means the surface states are filled by holes so that the surface states can't release electrons; thereby leakage current from surface states is reduced. The storage transistor can be isolated by using the control circuitry 220 to deactivate adjacent transistors (such as 310 and 350, discussed below) that are coupled to the source and drain of the storage transistor).

Figure 3:
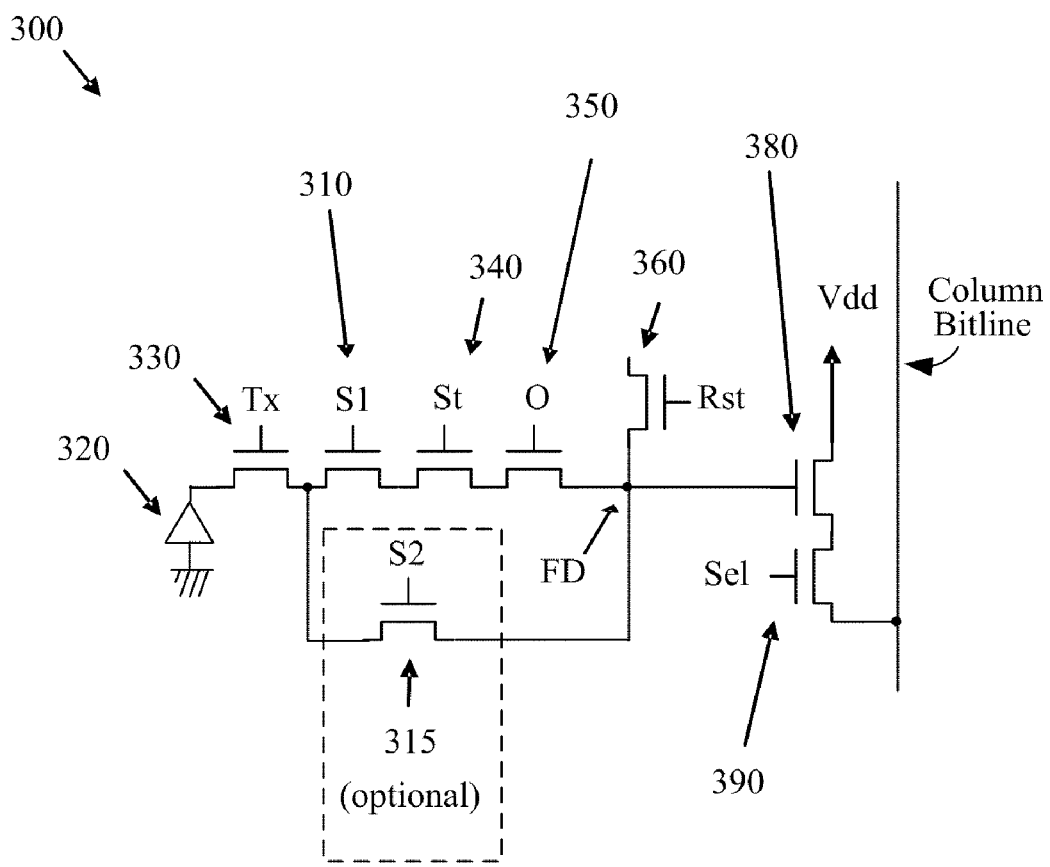
FIG. 3 is a circuit diagram illustrating pixel circuitry of an imaging pixel, in accordance with an embodiment of the invention.

FIG. 3 is a circuit diagram illustrating pixel circuitry 300 of a seven or eight transistor pixel with a global shutter, in accordance with an embodiment of the invention. Pixel circuitry 300 is one possible architecture of pixel circuitry for implementing each pixel within pixel array 200 of FIG. 2. Pixel circuitry 300 can be implemented using front-side or back-side illuminated pixel arrays.

The illustrated embodiment of imaging pixel 300 includes a select 1 transistor 310, a select 2 transistor 315, a photodiode 320, a transfer transistor 330, a storage transistor 340, an output transistor 350, a reset transistor 360, an amplifier transistor 380, and a row-select transistor 390 (also referred to as a readout transistor). In one embodiment, the transistors, with the exception of transfer transistor 330, are sized similarly, which reduces space (required by the large shutter transistor of the conventional art) and increases the fill factor.

Figure 5:
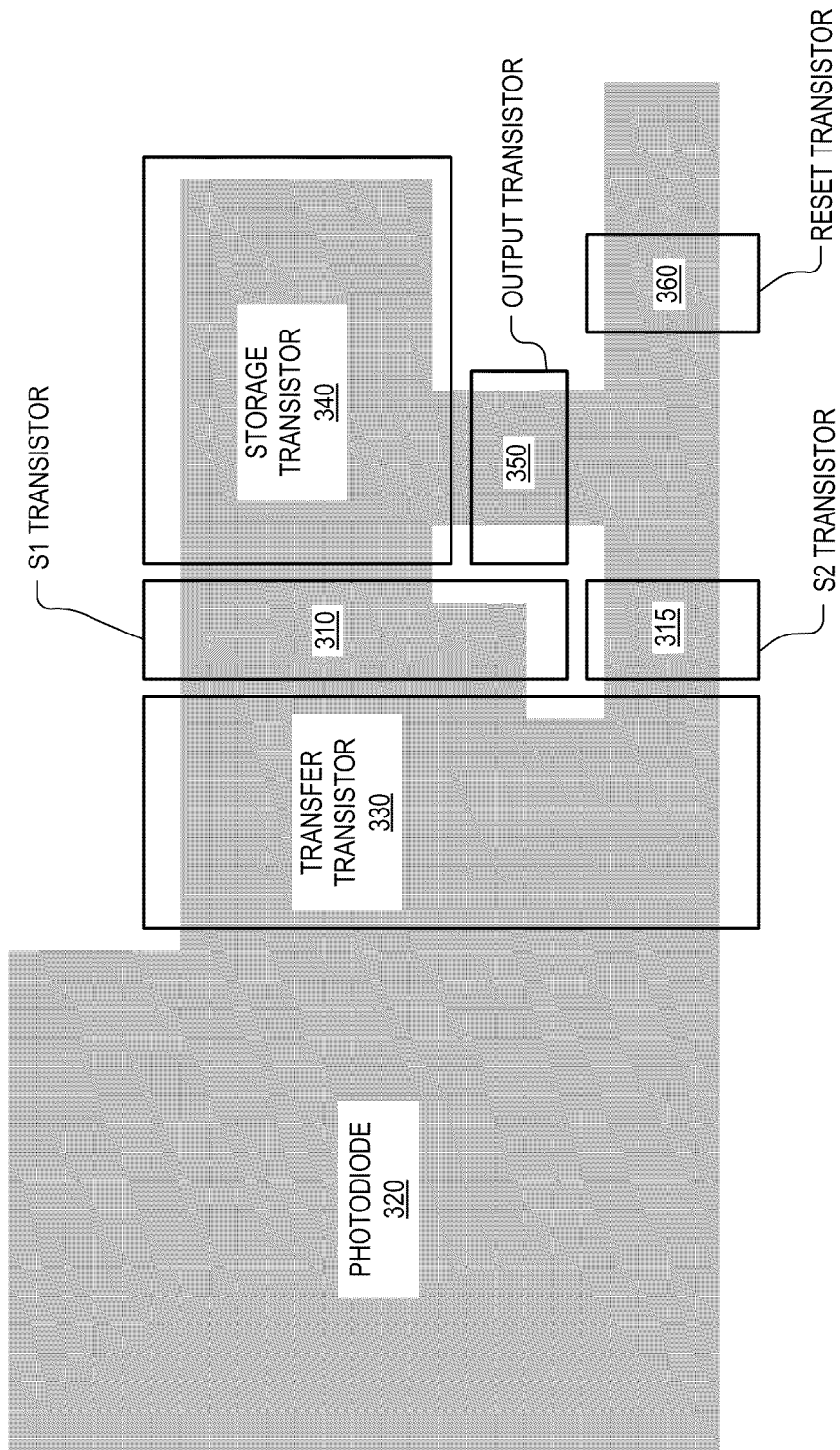
FIG. 5 illustrates transistor layout of a portion of an imaging pixel, in accordance with an embodiment of the invention.

FIG. 5 illustrates an example layout of a portion of imaging pixel 300 identifying the active areas and the individual gate regions of the transistors (excluding amplifier transistor 380 and row select transistor 390). The storage gate can have a buried channel or a surface channel. In one embodiment, the storage gate is formed above a dielectric region that is in turn above a region implanted (or diffused) with a light dopant of phosphorus or arsenic. As illustrated, the gates of select 1 transistor 310, select 2 transistor 315, output transistor 350, and reset transistor 360 are all significantly smaller than the gate of transfer transistor 330, thereby increasing the fill factor of pixel array 205. In one embodiment, there is only channel doping connecting the transfer transistor 330, select 1 transistor 310, storage transistor 340, output transistor 350, and select 2 transistor 315. As such, these transistors act like a charge coupled device. In this case, a shutter gate isn't necessary.

In one embodiment, photodiode 320 can be fully reset by selectively activating select 2 transistor 315 when the reset transistor 360 and transfer transistor 330 are activated. Select 2 transistor 315 is illustrated as optional to indicate that the technique of applying a negative gate voltage to storage transistor 340 can be used in imaging pixels that either include or exclude select 2 transistor 315.

In operation, a controller such as control circuitry 220 can be used to control the pixel circuity 300 as follows. Reset transistor 360 is coupled to a voltage source, such as Vdd. Reset transistor 360 is activated, which precharges node FD. Select 2 transistor 315 and transfer transistor 330 are activated, which precharges photodiode 320. Select 2 transistor 315 and transfer transistor 330 are deactivated, which allows photodiode 320 to integrate by accumulating photo-voltaically generated electrons during the image acquisition window. A negative voltage (e.g., −1.2 V) can be applied to the gate of storage transistor 340 before integration to accumulate holes in a region under the gate. After integration, transfer transistor 330 receives a transfer signal and select 1 transistor 310 and storage transistor 340 are activated, which transfers the charge accumulated in photodiode 320 to a storage transistor 340 where the charge is held until it is ready to be read out. In one embodiment, the gate of storage transistor 340 can be activated using a voltage of around 2.8 to 3.2 volts, for example.

When reset transistor 360 is deactivated, the charge present at the FD node is gradually reduced from leakage (e.g., due to dark current). The FD node is coupled to control the gate of amplifier transistor 380. The amplifier transistor 380 is coupled between the power rail Vdd and row select transistor 390. Amplifier transistor 380 operates as a source-follower. The "dark" voltage at the FD node can be measured by activating row select transistor 390 to selectively couple the output of pixel circuitry 300 to the readout column bitline under control of a select signal SEL. The "signal" charge (currently stored at storage transistor 340) can be read by activating output transistor 350, which couples the charge to the FD node, which in turn biases the gate of amplifier transistor 380 to produce a voltage that is coupled to the column bitline via row select transistor 390. In one embodiment, the row select transistor 390 can be omitted such that the drain of amplifier transistor 380 can be coupled directly to the column bitline. In this embodiment, amplifier transistor 380 may be referred to as the "readout transistor." When row select transistor 390 is present, it is referred to as the "readout transistor." In one embodiment, both amplifier transistor 380 and row select transistor 390 can be removed from imaging pixel 300, in which case output transistor 350 operates as the "readout transistor."

In one embodiment, the transfer signal, the reset signal, and the select signal are generated by control circuitry 220. In an embodiment where pixel array 205 operates with a global shutter, the global shutter signal (e.g., the Tx signal) is coupled to the gate of each transfer transistor 330 in the entire pixel array 205 to simultaneously commence charge transfer from each pixel's photodiode 320. In one embodiment, the global shutter signal is generated by global shutter circuitry 221 included within control circuitry 220. As such, transfer transistor 330 and the Tx signal provide the dual purpose of image shutter or shutter signal and charge transferor or transfer signal for reading out the image charge from photodiode 320. Furthermore, photodiode 320 is reset via transfer transistor 330 and select 2 transistor 315 (when present).

Figure 6A:
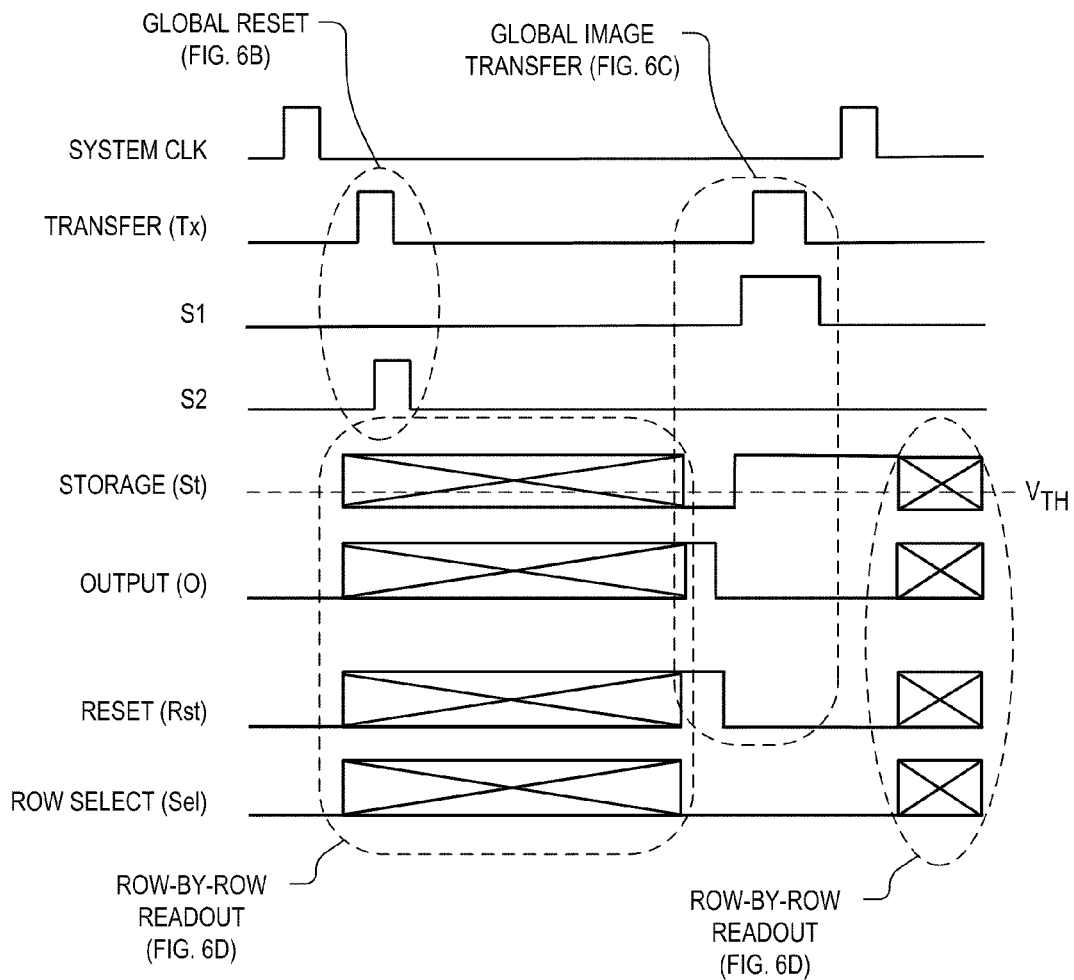
FIGS. 6A-D are timing diagrams illustrating operation of an imaging pixel, in accordance with an embodiment of the invention.
Figure 6B:
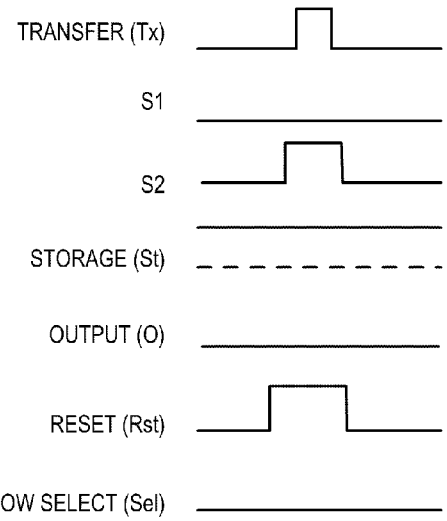
Figure 6C:
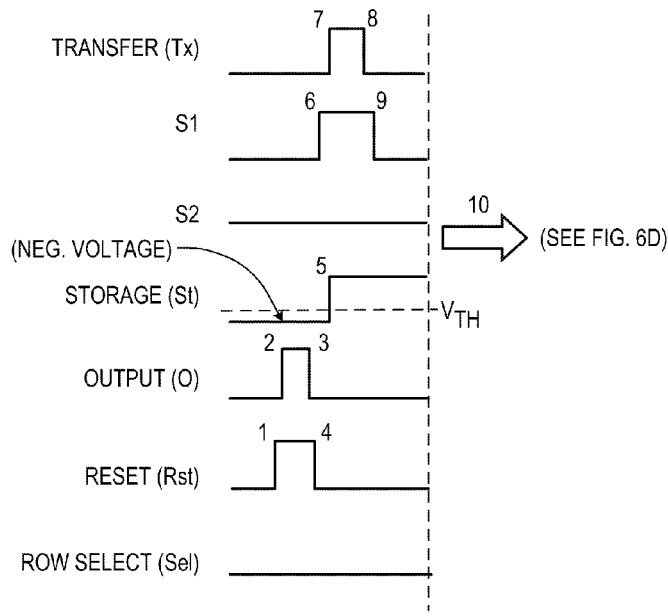
Figure 6D:
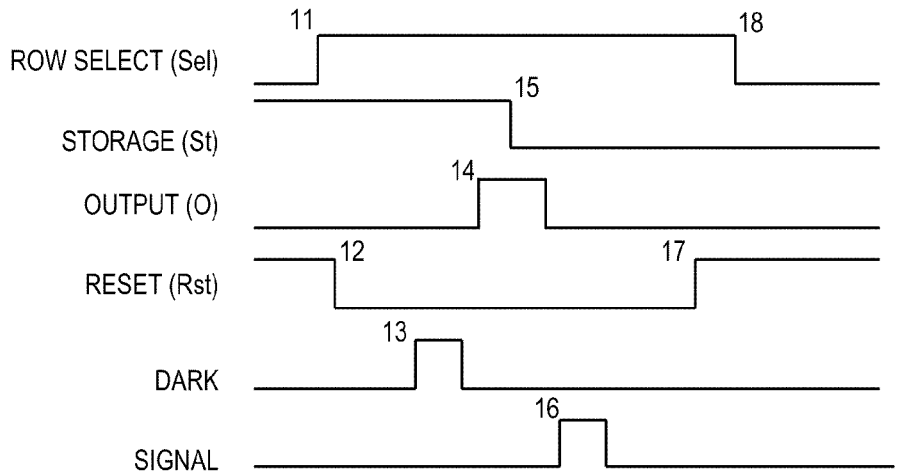

FIGS. 6A-D are timing diagrams illustrating the operation of imaging pixel 300 and pixel array 205, in accordance with an embodiment of the invention. FIG. 6A illustrates the overall timing operation of imaging pixel 300, while FIG. 6B is a close up of a global reset operation, FIG. 6C is a close up of a global image transfer operation, and FIG. 6D is a close up of a row-by-row readout operation, all in accordance with an embodiment of the invention.

Referring to FIG. 6A, a system clock signal is generated by control circuitry 220 for synchronizing control signals such as those shown in FIG. 6A. To prepare pixel array 205 for a next image acquisition, the imaging pixels are reset. During a global reset event (FIG. 6B), all transfer transistors 330, select 2 transistors 315, and reset transistors 360 in pixel array 205 are active. Those storage transistors 340 currently storing an image signal that has not yet been readout from a previous image acquisition are active, while those storage transistors 340 of imaging pixels that have already been readout are deactivated. Finally, all row select transistors are also deactivated. Pixel array 205 is globally reset between image acquisitions to precharge the photodiode 320 and the FD node of each imaging pixel 300. Furthermore, the transfer signal Tx applied to the gate terminal of transfer transistors 330 operates as a global shutter. Upon deactivating the transfer signal Tx, each photodiode 320 commences accumulating electrons in response to incident light.

Operation of a given imaging pixel 300 within pixel array 205 to transfer an image from photodiode 320 to storage transistor 340 is now described with reference to FIG. 6C. Prior to commencing image transfer the gates of storage transistors 340 are negatively biased at least 0.5 V below their threshold voltage $V_{TH}$ to reduce leakage current from surface states beneath the storage gate. At time 1, reset transistors 360 are activated, at time 2 the output transistors 350 are activated. While reset transistors 360 and output transistors 350 are active, the storage transistor 340 remains deactivated, and even negatively biased. Activating reset transistors 360 and output transistors 350 acts to precharge FD and signal charges beneath storage gate are swept out to FD.

At times 3 and 4, the output transistors 350 and reset transistors 360 are deactivated, respectively. At time 5, storage transistor 340 is activated. At time 6, select 1 transistor 310 is activated to connect transfer transistor 330 to the storage capacitance of storage transistor 340. At time 7, transfer transistors 330 are temporarily activated and operate as a global shutter signal. With transfer transistors 330 and select 1 transistors 310 activated, the image signal is transferred from photodiodes 320 to their respective storage transistors 340. The transfer transistors 330 and select 1 transistors 310 are subsequently deactivated at times 8 and 9, respectively, to store and isolate the image signal until it can be readout at a subsequent time 10 using the row-by-row readout technique discussed below.

Once image signals have been acquired and the image signals transferred from the photodiodes 320 to their respect storage transistors 340, the image signals are ready for row-by-row readout by readout circuit 210 under control of control circuitry 220. FIG. 6D illustrates row-by-row readout timing, in accordance with an embodiment of the invention. From FIG. 6A it should be appreciated that row-by-row readout from a previous image acquisition may still be underway for some pixels as the global reset for the next image acquisition is commencing.

At time 11, row select transistor 390 (for a row to be read out) is activated, which couples a voltage produced by amplifier transistor 380 (which in the embodiment is configured as a source-follower) to the column bitline for the activated row. At time 12, reset transistor 360 is deactivated, which decouples a power supply rail, such as Vdd, from the FD node. The voltage at the FD node biases the gate of amplifier transistor 380, which produces an output voltage (dark voltage) in response. The output voltage is coupled to the bitline by the activated row select transistor 390. At time 13, the voltage on the column bit line (e.g., the dark voltage) is sampled.

At time 14, output transistor 350 is activated, which transfers the image signal charge from storage transistor 340 to the floating diffusion at the FD node. In turn, the voltage at the FD node biases the gate of amplifier transistor 380, which produces an output voltage. The output voltage is coupled to the bitline via the activated row select transistor 390. At time 15, storage transistor 340 is deactivated, which causes the active channel under the gate of storage transistor 340 to close (and cause a greater portion of the signal charge to be transferred to the FD node). In one embodiment, the gate of storage transistor 340 is negatively biased. At time 16, the output voltage on the column bit line (e.g., the signal) is sampled. Although FIG. 6D illustrates the output transistor 350 are being deactivated prior to signal sampling at time 16, in other embodiments the gate of output transistor 350 can be deactivated later, such as after the output signal is sampled at time 16. At time 17, reset transistor 360 is activated. At time 18, row select transistor 390 is deactivated. The sequence of times 13 through 18 can be repeated as desired to read out each row of the pixel array.

Figure 7:
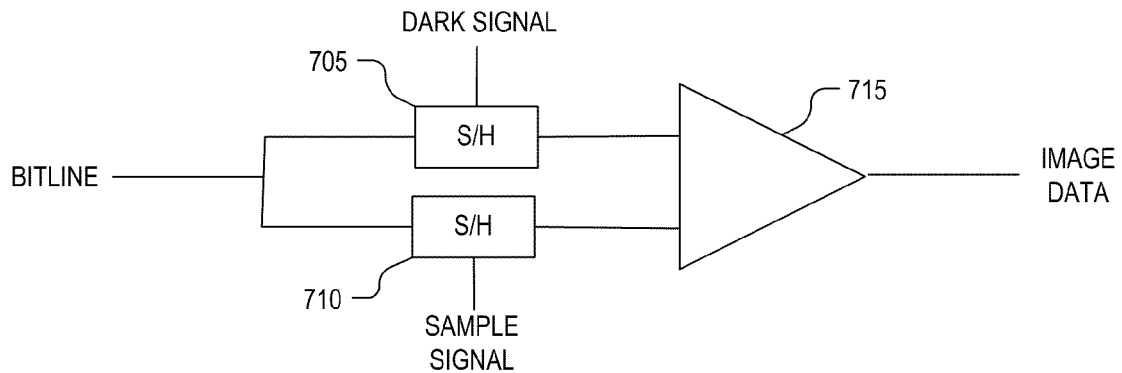
FIG. 7 illustrates a double correlated sampler, in accordance with an embodiment of the invention.

FIG. 7 is a schematic diagram illustrating double correlated sampling of imaging pixel 300, in accordance with an embodiment of the invention. The dark signal causes a sample/hold device 705 to sample a dark current reference level for image pixel 300. The sample signal causes a sample/hold device 710 to sample the image signal for image pixel 300. Amplifier 715 can be a differential amplifier, which produces a double correlated sample which uses the dark current reference level to scale or offset the image signal to generate the image data. The image data can be read, for example, by an analog to digital converter that is coupled to the output of the amplifier.

Figure 8:
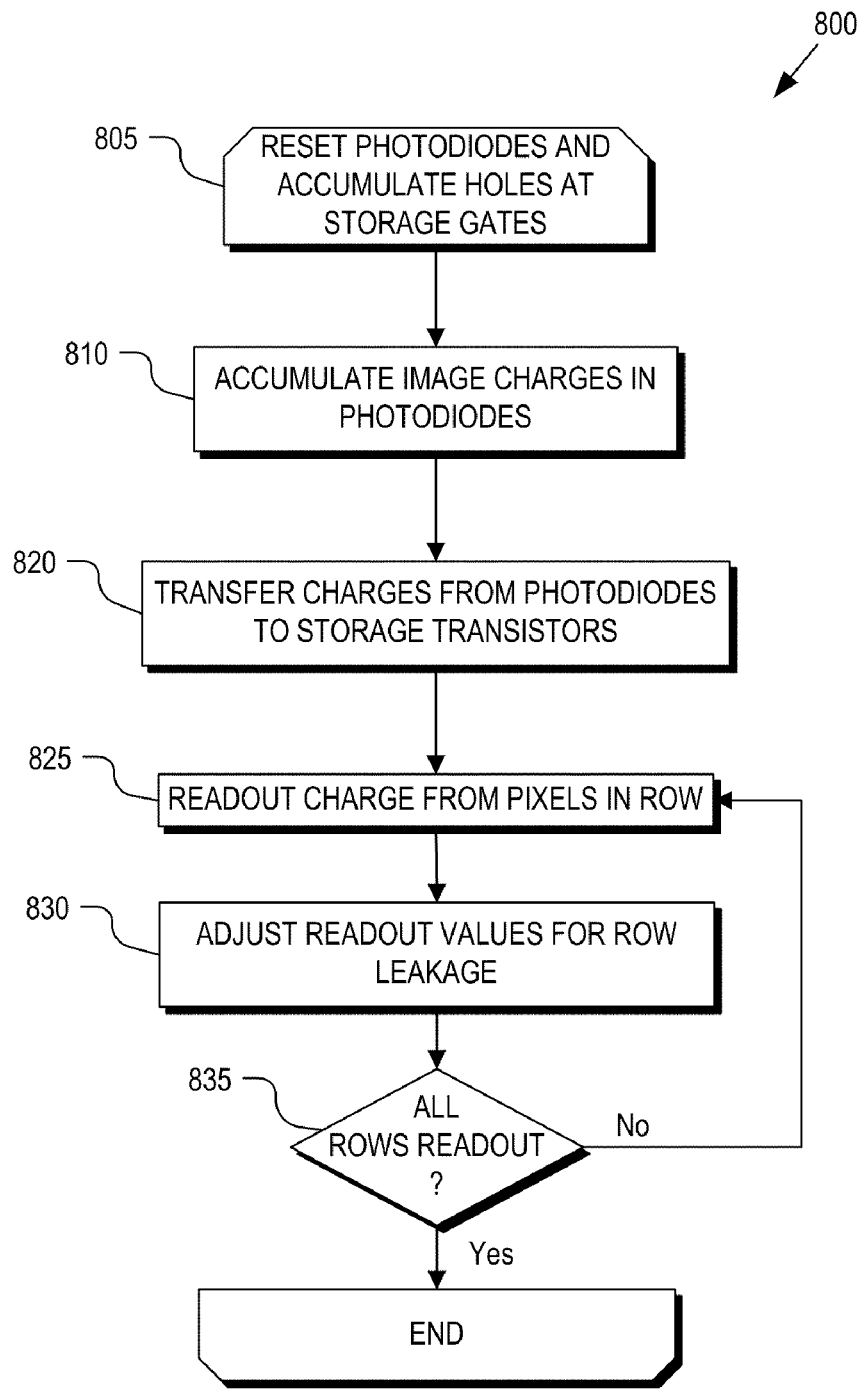
FIG. 8 is a flow chart illustrating a process for operating an imaging system, in accordance with an embodiment of the invention.

FIG. 8 is a flow chart illustrating a process 800 for operating imaging system 200, in accordance with an embodiment of the invention. Process 800 illustrates a row-by-row readout of pixel array 205; however, it should be appreciated that process 800 may be sequentially or concurrently executed by each pixel in a row in pixel array 205 depending upon whether a rolling shutter or global shutter is used. The order in which some or all of the process blocks appear in process 800 should not be deemed limiting. Rather, one of ordinary skill in the art having the benefit of the present disclosure will understand that some of the process blocks may be executed in a variety of orders not illustrated.

In a process block 805, photodiode 320 is reset. Resetting includes discharging or charging photodiode PD to a predetermined voltage potential, such as Vdd. The reset is achieved by asserting both the RST signal to enable reset transistor 360, enabling the select 2 transistor 315, and asserting the TX signal to enable transfer transistor 330. Thus, the photodiode region 320 and FD are coupled to power rail Vdd. During the reset time, storage transistor 340 may or may not be storing previous image data or can have a negative voltage applied to its gate such that holes are accumulated in anticipation of the next image acquisition cycle.

Once reset, the RST signal and the TX signal are de-asserted to commence image acquisition by photodiode region 320 (process block 810). The incident photons cause charge to accumulate within the diffusion region of the photodiode. Once the image acquisition window has expired, the RST signal is again de-asserted and the accumulated charge within photodiode region 320 is transferred via the transfer transistor 330 and select 1 transistor 310 to storage transistor 340 by asserting the TX signal and the storage signal S1 (process block 820). In the case of a global shutter, the global shutter signal is asserted simultaneously, as the TX signal, to all pixels within pixel array 205 during process block 820. This results in a global transfer of the image data accumulated by each pixel into the pixel's corresponding storage transistor 340.

Once the image data is transferred into storage transistor 340, the transistor 340 is used to store the image charge for readout. In a process block 825, the SEL signal is asserted to transfer the stored image data onto the readout column for output to the function logic 215 via readout circuitry 210. It should be appreciated that readout may occur on a per row basis via column lines (illustrated), on a per column basis via row lines (not illustrated), on a per pixel basis (not illustrated), or by other logical groupings.

When the readout of a logical group has occurred, the readout values can be adjusted to compensate for leakage (as in block 830). Reference values used for compensation can include a reference pixel (such as a pixel set to a known value and held by the storage gate), calibration (such as exposing the pixel array to known illuminations and storing adjustment values on a per-row basis), calculation (such as by using an adjustment function that uses a readout time or row number as an input, where rows readout later have higher adjustment values), combinations thereof, and the like. Thus pixels in a row can be adjusted by, for example, adding to (or multiplying by) an adjustment value for each pixel in the row.

In process block 835, it is determined whether (for example) all rows have been readout. If not, the process proceeds to block 825, where the next row is read out. Once the image data of all pixels has been readout, process 800 can end (or return to process block 805 to reset each photodiode for the next image capture).

The processes explained above are described in terms of computer software and hardware. The techniques described may constitute machine-executable instructions embodied within a machine (e.g., computer) readable medium, that when executed by a machine will cause the machine to perform the operations described. Additionally, the processes may be embodied within hardware, such as an application specific integrated circuit ("ASIC") or the like.

A machine-accessible or machine-readable storage medium includes any mechanism that provides (i.e., stores) information in a form accessible by a machine (e.g., a computer, network device, personal digital assistant, manufacturing tool, any device with a set of one or more processors, etc.). For example, a machine-accessible storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An apparatus, comprising:
   a photodiode to accumulate an image charge;
   a storage transistor to store the image charge;
   a transfer transistor coupled between the photodiode and an input of the storage transistor to selectively transfer the image charge from the photodiode to the storage transistor;
   an output transistor coupled to an output of the storage transistor to selectively transfer the image charge to a readout node;
   a reset transistor coupled to the readout node;
   a controller configured to apply a negative voltage to a gate of the storage transistor before activating the gate of the storage transistor to store the image charge;
   a first select transistor coupled between the transfer transistor and the storage transistor to selectively transfer the image charge from the transfer transistor to the storage transistor; and
   a second select transistor coupled between the readout node and a circuit node between the transfer transistor and the first select transistor, the controller further configured to reset the photodiode by activating the transfer transistor, the second select transistor, and the reset transistor.

2. The apparatus of claim 1, wherein the negative voltage is at least 0.5 volts below a threshold voltage of the storage transistor.

3. The apparatus of claim 1, wherein the negative voltage is approximately −1.2 volts.

4. The apparatus of claim 1, wherein the readout node comprises a doped floating diffusion.

5. The apparatus of claim 1, wherein the transfer transistor is larger than each of the first and second select transistors, the output transistor, and the reset transistor.

6. The apparatus of claim 1, wherein the transfer transistor, the first select transistor, the second select transistor, the storage transistor, and the output transistor are directly interconnected by their channels and operate collectively as a charged coupled device.

7. The apparatus of claim 1, further comprising:
an amplifier transistor having a gate coupled to the readout node; and
a row select transistor coupled between a bitline and the amplifier transistor.

8. A method of operation of a pixel array, the method comprising:
resetting a photodiode within each pixel of the pixel array prior to accumulating an image charge;
negatively biasing a gate of a storage transistor within each of the pixels while the storage transistor is off and prior to temporarily storing the image charge within the storage transistor;
asserting a global shutter signal to transfer the image charge accumulated by the photodiode of each pixel to the storage transistor of each pixel; and
storing the image charge within the storage transistor of each pixel until the image charge is readout, wherein:
a first portion of the storage transistors whose image charge has already been readout for a given imaging cycle are off while resetting the photodiode of each pixel, and
a second portion of the storage transistors whose image charge has not already been readout for the given imaging cycle are on while resetting the photodiode of each pixel.

9. The method of claim 8, wherein negatively biasing the gate comprises biasing the gate at least 0.5 volts below a threshold voltage of the storage transistor.

10. The method of claim 8, wherein resetting the photodiode and asserting the global shutter signal to transfer the image charge both comprise activating a transfer transistor coupled between the photodiode and the storage transistor.

11. The method of claim 10, wherein resetting the photodiode of each pixel comprises contemporaneously pre-charging the photodiode of each pixel within the pixel array.

12. The method of claim 10, wherein resetting the photodiode within each pixel of the pixel array prior to accumulating the image charge comprises:
deactivating the a first select transistor coupled between the transfer transistor and the storage transistor;
activating a reset transistor of each pixel; and
activating a second select transistor coupled between the reset transistor and a circuit node disposed between the transfer transistor and the first select transistor.

13. The method of claim 8, wherein the image charge of each pixel is readout using a row-by-row readout of the pixel array and wherein negatively biasing the gate of the storage transistor within each of the pixels while the storage transistor is off reduces leakage current.

14. An imaging system comprising:
an array of imaging pixels having the imaging pixels arranged in rows and columns, wherein each imaging pixel includes:
a photodiode to accumulate an image charge;
a storage transistor to store the image charge;
a transfer transistor coupled between the photodiode and the storage transistor;
a first select transistor coupled between the transfer transistor and an input of the storage transistor;
an output transistor coupled to an output of the storage transistor and a readout node;
a reset transistor coupled between a voltage rail and the readout node; and
a second select transistor coupled between the readout node and a circuit node between the transfer transistor and the first select transistor; and
control circuitry coupled to the array of imaging pixels to control timing operation of the storage transistor, the transfer transistor, the first select transistor, the output transistor, the reset transistor, and the second select transistor, wherein the control circuit is configured to operate the transfer transistor to reset the photodiode through the second select transistor and to operate the transfer transistor as an image shutter to commence transfer of the image charge to the storage transistor through the first select transistor.

15. The imaging system of claim 14, wherein the control circuit is configured to apply a negative bias voltage to a gate storage transistor being at least 0.5 volts below a threshold voltage of the storage transistor while the storage transistor is turned off to reduce leakage current.

16. The imaging system of claim 14, wherein the transfer transistor, the first select transistor, the second select transistor, the storage transistor, and the output transistor are directly interconnected by their channels and operate collectively as a charged coupled device.

* * * * *